(12) United States Patent
White et al.

(10) Patent No.: US 8,206,075 B2
(45) Date of Patent: Jun. 26, 2012

(54) METHODS AND APPARATUS FOR SEALING A CHAMBER

(75) Inventors: John M. White, Hayward, CA (US); Shinichi Kurita, San Jose, CA (US); William N. Sterling, Santa Clara, CA (US); Yoshiaki Tanase, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 877 days.

(21) Appl. No.: 11/145,018

(22) Filed: Jun. 2, 2005

(65) Prior Publication Data

US 2005/0285992 A1     Dec. 29, 2005

Related U.S. Application Data

(60) Provisional application No. 60/587,114, filed on Jul. 12, 2004, provisional application No. 60/576,906, filed on Jun. 2, 2004.

(51) Int. Cl.
*H01L 21/67* (2006.01)
*C23C 16/00* (2006.01)

(52) U.S. Cl. .......................... 414/217; 118/715; 118/733

(58) Field of Classification Search .................. 220/810; 414/217, 939; 118/724, 219, 719, 733; 219/390
See application file for complete search history.

(56) References Cited

U.S. PATENT DOCUMENTS

| | | |
|---|---|---|
| 4,854,600 A | 8/1989 | Halling et al. |
| 4,944,403 A | 7/1990 | LeKuch et al. |
| 5,226,632 A | 7/1993 | Tepman et al. |
| 6,089,543 A | 7/2000 | Freerks |
| 6,338,626 B1 * | 1/2002 | Saeki ............................ 432/243 |
| 6,405,423 B1 * | 6/2002 | Donde ............................ 29/428 |
| 6,435,868 B2 * | 8/2002 | White et al. ................... 432/247 |
| 6,932,354 B2 * | 8/2005 | Kane et al. ..................... 277/608 |
| 7,018,517 B2 * | 3/2006 | Kurita et al. ............. 204/298.25 |
| 7,086,638 B2 | 8/2006 | Kurita et al. |
| 7,207,766 B2 * | 4/2007 | Kurita et al. ................... 414/641 |
| 7,282,460 B2 * | 10/2007 | Jang ............................ 438/800 |
| 7,413,099 B2 | 8/2008 | Takahashi et al. |
| 2003/0012624 A1 * | 1/2003 | Kinnard et al. ............... 414/217 |
| 2004/0119240 A1 | 6/2004 | Hashimoto |

(Continued)

FOREIGN PATENT DOCUMENTS

EP        1526565 A2 *   4/2005

(Continued)

OTHER PUBLICATIONS

U.S. Appl. No. 11/480,615, filed Jun. 2, 2005.

(Continued)

*Primary Examiner* — Bryon P. Gehman
*Assistant Examiner* — Shawn Braden
(74) *Attorney, Agent, or Firm* — Dugan & Dugan, PC

(57) ABSTRACT

In certain aspects, a load lock chamber is provided that includes a body having at least one sealing surface wall including a sealing surface. The sealing surface wall has an opening adjacent the sealing surface adapted to input or output a substrate. The body further includes a plurality of side walls. The load lock chamber also includes a top coupled to the body. The top includes one or more openings that divide the top into a first portion and a second portion. The load lock chamber further includes one or more top sealing members adapted to cover each opening of the top. Each top sealing member absorbs a movement of the first portion of the top relative to the second portion of the top. Numerous other aspects are provided.

16 Claims, 12 Drawing Sheets

U.S. PATENT DOCUMENTS

| | | | |
|---|---|---|---|
| 2005/0095088 A1* | 5/2005 | Kurita et al. | 414/217 |
| 2006/0028596 A1 | 2/2006 | Leung et al. | |
| 2007/0204958 A1* | 9/2007 | Lee et al. | 156/345.31 |

FOREIGN PATENT DOCUMENTS

| | | | |
|---|---|---|---|
| JP | 64-003371 | | 1/1989 |
| JP | 04-257244 | | 9/1992 |
| JP | 08-258787 | | 10/1996 |
| JP | 09-207668 | | 8/1997 |
| JP | 2001140801 | A | 5/2001 |
| JP | 2001-519971 | | 10/2001 |
| JP | 2002-068364 | | 3/2002 |
| JP | 2002-299272 | | 10/2002 |
| JP | 2003-037108 | | 2/2003 |
| JP | 2003-267916 | | 9/2003 |
| KR | 1020000051650 | | 8/2000 |
| KR | 1020010021748 | | 3/2001 |
| KR | 1020010071717 | | 7/2001 |
| KR | 1020030016188 | A | 2/2003 |
| KR | 10-2003-0035350 | * | 6/2003 |
| KR | 20040013294 | | 2/2004 |
| TW | 70375 | | 9/1985 |
| TW | 0461013 | B | 10/2001 |
| TW | 0463207 | B | 11/2001 |
| TW | 0554390 | B | 9/2003 |
| TW | 0554504 | B | 9/2003 |
| WO | WO 98/01891 | | 1/1998 |
| WO | WO 02/05330 | A2 | 1/2002 |
| WO | WO 03/023829 | A2 | 3/2003 |
| WO | WO 03064885 | A1 | 8/2003 |

OTHER PUBLICATIONS

Office Action issued on Jul. 1, 2008 to Japanese Patent Application No. P2005-163012.
(App. No. 200510103894.8) OA dated Sep. 19, 2008.
(App. No. 2005-70755) OA dated May 21, 2008.
(App. No. 2005-70755) OA dated May 26, 2007.
(App. No. 094118263) SR dated Jun. 26, 2007.
(App. No. 094118263) OA dated Dec. 21, 2007.
Oct. 21, 2009 Response to Office Action of U.S. Appl. No. 11/194,503 mailed Jul. 12, 2009.
Office Action of Chinese Application No. 200510106737.2 dated Jun. 5, 2009.
Office Action of Japanese Application No. 2005-224297 dated Jun. 2, 2009.
Office Action of South Korea Application No. 10-2005-47329 dated Jul. 27, 2006.
Office Action of U.S. Appl. No. 11/194,503 mailed Jul. 21, 2009.
Final Office Action of U.S. Appl. No. 11/194,503 mailed Jan. 6, 2010.
Amendment submitted with filing of RCE of U.S. Appl. No. 11/194,503, filed Apr. 6, 2010.
Taiwan Search Report of Taiwan Application No. 94126261 dated Feb. 27, 2007.
Restriction Requirement of U.S. Appl. No. 11/194,503 mailed Mar. 31, 2009.
Apr. 30, 2009 Response to Restriction Requirement of U.S. Appl. No. 11/194,503 mailed Mar. 31, 2009.
Examiner Interview Summary of U.S. Appl. No. 11/194,503 mailed Apr. 8, 2010.
Interview Summary of U.S. Appl. No. 11/194,503, filed Apr. 27, 2010.
Office Action of Japanese Patent Application no. 2009-252239 dated Feb. 14, 2012.

* cited by examiner

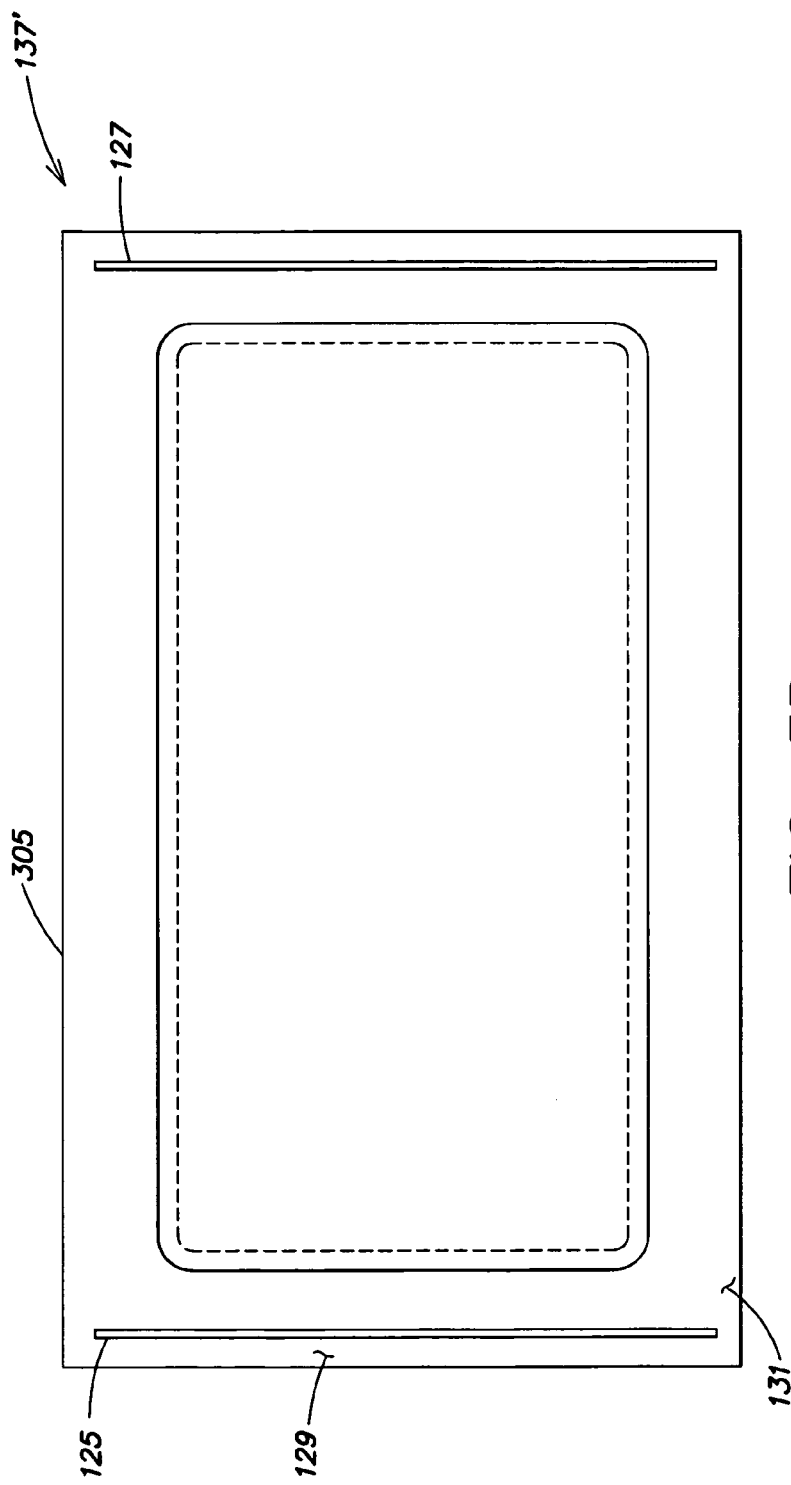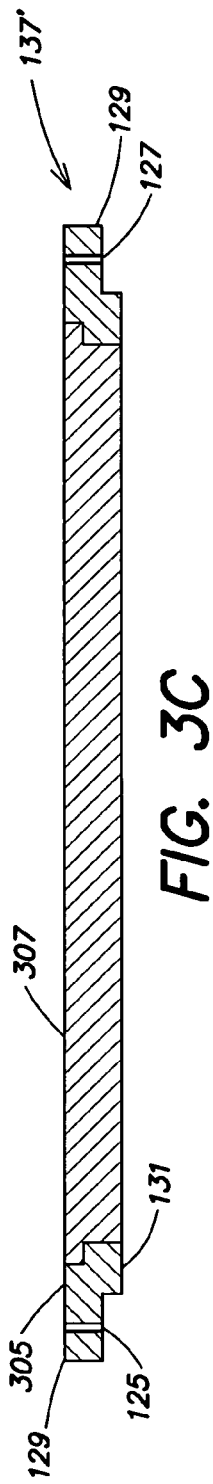
FIG. 3B
FIG. 3C

US 8,206,075 B2

METHODS AND APPARATUS FOR SEALING A CHAMBER

The present application claims priority to U.S. Provisional Patent Application Ser. No. 60/587,114, filed Jul. 12, 2004 and U.S. Provisional Patent Application Ser. No. 60/576,906, filed Jun. 2, 2004, which are hereby incorporated by reference herein in their entirety for all purposes.

FIELD OF THE INVENTION

The present invention relates generally to flat panel display and/or electronic device manufacturing, and more particularly to methods and apparatus for sealing a chamber.

BACKGROUND

To increase flat panel display and/or electronic device manufacturing device throughput, a second load lock may be stacked on a first load lock. Each load lock may include one or more load lock doors for sealing the load lock such that a vacuum may be formed inside the load lock. Pressure gradients (e.g., atmospheric pressure outside a load lock and/or vacuum pressures within the load lock) may cause a top or bottom of a load lock to move and thus one or more walls of the load lock to move. Movement of a load lock wall that includes a load lock door may cause friction between a sealing gasket, the load lock wall and the load lock door. Such friction may cause the gasket to wear and generate particulates that create defects during flat panel display and/or electronic device manufacturing.

Load locks may be designed with one or more walls, a top and/or a bottom of a large thickness such that the pressure induced movement of the walls that include sealing surfaces is reduced. However, increasing the thickness of walls, a top and/or a bottom of a load lock requires extra material, and therefore, increases the cost and weight of the load lock. Further, increasing the thickness of the top and/or bottom of one or more stacked load locks increases the pitch of the load locks, which increases the complexity and cost of a manufacturing facility which includes the stacked load locks by complicating and/or increasing the cost of transfer mechanisms that transfer substrates to and/or from the stacked load locks.

Accordingly, improved methods and apparatus for sealing a chamber (e.g., a load lock) are desired.

SUMMARY OF THE INVENTION

In certain aspects of the invention, a load lock chamber is provided that includes a body having at least one sealing surface wall including a sealing surface. The sealing surface wall has an opening adjacent the sealing surface adapted to input or output a substrate. The body further includes a plurality of side walls. The load lock chamber also includes a top coupled to the body. The top includes one or more openings that divide the top into a first portion and a second portion. The load lock chamber further includes one or more top sealing members adapted to cover each opening of the top. Each top sealing member absorbs a movement of the first portion of the top relative to the second portion of the top.

In some aspects of the invention, a method for sealing a first load lock chamber is provided that includes the steps of (1) defining a gap between a central portion of a top and a sealing surface wall of the first load lock chamber so as to reduce movement of the sealing surface wall caused by movement of the central portion of the top; and (2) sealing the gap with a flexible gap sealing member.

In certain aspects of the invention, a load lock system is provided that includes a plurality of stacked load lock chambers. Each load lock chamber includes a body having (1) at least one sealing surface wall including a sealing surface, the sealing surface wall having an opening adjacent the sealing surface adapted to input or output a substrate; and (2) a plurality of side walls. Each load lock chamber also includes (a) a top coupled to the body, wherein the top includes one or more openings that divide the top into a first portion and a second portion; (b) one or more top sealing members adapted to cover each opening of the top, wherein each top sealing member absorbs a movement of the first portion of the top relative to the second portion of the top; (c) a bottom coupled to the body, wherein the bottom includes one or more openings that divide the bottom into a first portion and a second portion; and (d) one or more bottom sealing members adapted to cover each opening of the bottom, wherein each bottom sealing member absorbs a movement of the first portion of the bottom relative to the second portion of the bottom. Numerous other aspects are provided.

Other features and aspects of the present invention will become more fully apparent from the following detailed description, the appended claims and the accompanying drawings.

BRIEF DESCRIPTION OF THE FIGURES

FIGS. 3B and 3C are a top view and a side cross-sectional view, respectively, of a second exemplary bottom for a first load lock.

FIG. 3I is a cross-sectional, perspective view of a portion of the bottom of FIGS. 3B-3E that illustrates an exemplary pumping channel that may be employed to evacuate the slot of FIG. 3H.

DETAILED DESCRIPTION

The present invention relates to reducing movement of a chamber (e.g., load lock) sealing surface due to a movement of a load lock chamber top and/or bottom caused by a pressure or pressure change in the load lock chamber or an adjacent load lock chamber stacked above or below the chamber. Further, an inventive chamber door (e.g., load lock chamber door) may couple to and move with a sealing surface wall of the load lock chamber. As described below, the sealing surface wall of the load lock chamber may move due to a pressure or pressure change in the load lock chamber and/or a pressure or pressure change in an adjacent load lock chamber.

Figure 1:
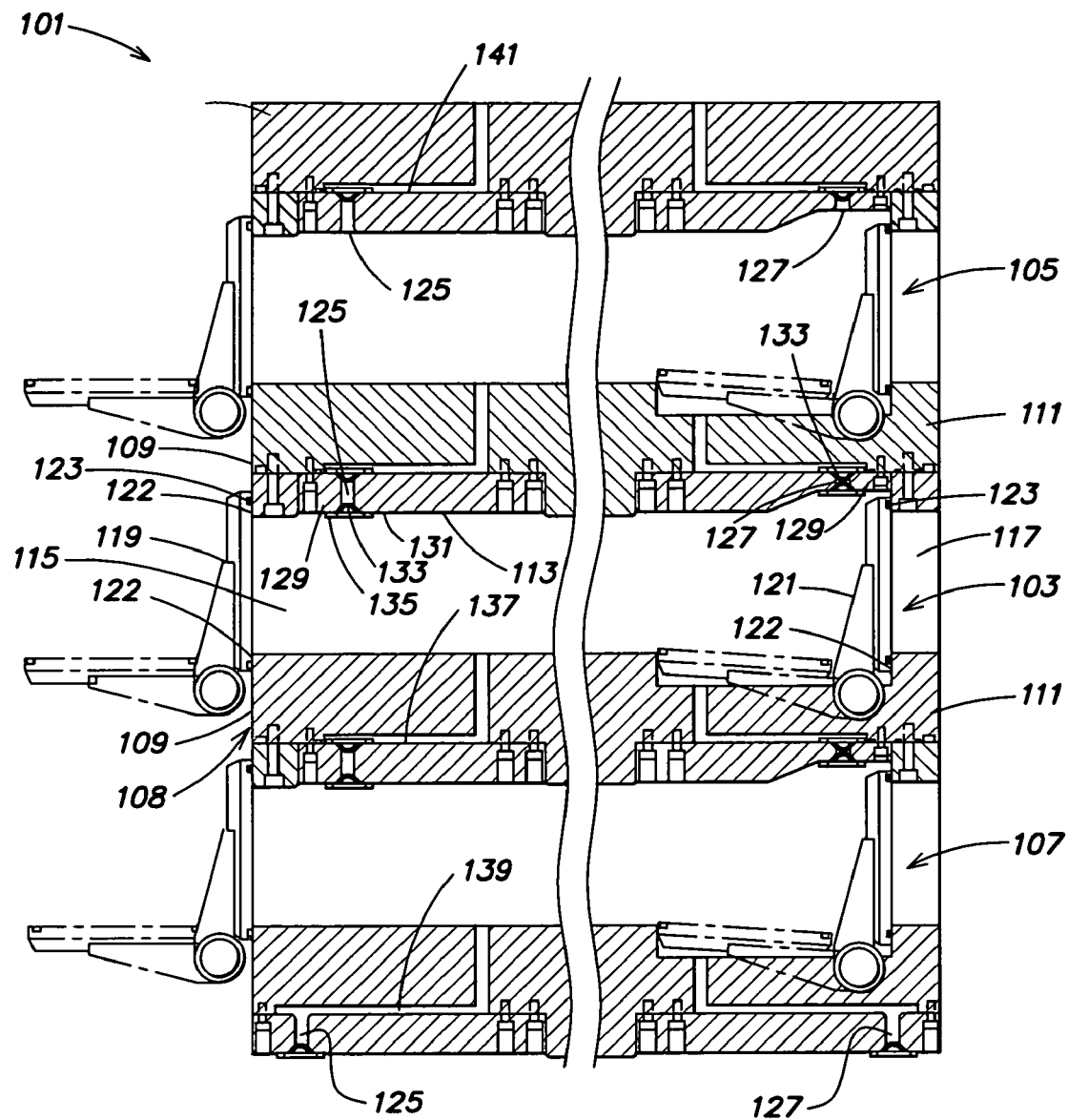
FIG. 1 illustrates a side view of a first exemplary load lock system in accordance with an embodiment of the invention.

FIG. 1 illustrates a side view of a first exemplary load lock system 101 in accordance with an embodiment of the invention. With reference to FIG. 1, the first exemplary load lock system 101 includes a plurality of load locks 103-107, which are vertically stacked. The first exemplary load lock system includes a first load lock 103 stacked below a second load lock 105 and stacked on top of a third load lock 107. The first load lock 103 includes a body 108 that defines a plurality of sealing surface walls 109, 111. The sealing surface walls 109, 111 may be formed of stainless steel, aluminum or the like. One or more of the sealing surface walls 109, 111 of the first load lock 103 includes an opening 115-117 for inputting and/or removing a substrate (e.g., a glass substrate, a polymer substrate, a semiconductor wafer, etc.) during flat panel display and/or electronic device manufacturing.

A load lock door 119-121 may be coupled to a respective sealing surface wall 109, 111 (e.g., to a sealing surface 122 of the sealing surface wall 109, 111 around the opening 115-117 in the sealing surface wall 109, 111 [109-111]) to seal the load lock 103. The load lock door 119-121 may be internal or external to the load lock 103. For example, the first load lock 103 includes an external door 119 adapted to couple to the first sealing surface wall 109 and seal the first opening 115, and an internal door 121 adapted to couple to the second sealing surface wall 111 and seal the second opening 117. A larger or smaller number of doors and/or different door positions may be employed. Each load lock door 119-121 may couple to the sealing surface wall 109, 111 via a gasket 123, such as an 0-ring.

The first load lock 103 includes a top 113 coupled to the sealing surface walls (e.g., an upper perimeter of the sealing surface walls 109, 111). The top 113 of the first load lock 103 serves as the bottom of the second load lock 105. Although, the top 113 shown in FIG. 1 is a multi-piece top, a one-piece top (e.g., a plate) may be employed. The top 113 of the first load lock 103 includes one or more slots 125-127 that define a first portion 129 and a second portion 131 of the top 113. Each of the one or more slots 125-127 defines openings in the top 113 (e.g., an opening in a top surface and a bottom surface of the top 113).

To seal the first load lock 103 from the second load lock 105, a flexible gap sealing member, such as a gasket 133, may be employed to cover the openings defined by each slot 125-127. For example, a double gasket (e.g., differential) seal may be employed. The gasket 133 may be an elastomer or a metal bellows (although other gasket configurations and/or materials may be employed). Further, a frame 135 may be coupled to and support each gasket 133 (e.g., by attaching each gasket to the top 113).

The first load lock 103 includes a bottom 137 coupled to the sealing surface walls 109-111 (e.g. a lower perimeter of the sealing surface walls 109-111). The bottom 137 of the first load lock 103 serves as the top of the third load lock 107. The bottom 137 of the first load lock 103 is similar to the top 113 of the first load lock 103 in structure and function and, therefore, will not be described in detail herein.

In a similar manner, additional load locks may be stacked above the second load lock 105 and/or below the third load lock 107. Alternatively, the second load lock 105 may be the top of the stacked load lock system 101 and/or the third load lock 107 may be the bottom of the stacked load lock system 101. In embodiments in which the third load lock 107 is the bottom of the stacked load lock system 101, a bottom 139 of the third load lock 107 may be similar to the bottom 137 of the first load lock 103. However, because the bottom 139 of the third load lock 107 does not need to accommodate a door of a load lock below the third load lock 107, the bottom 139 of the third load lock 107 may be modified accordingly. For example, the bottom surface of the bottom 139 need not include a cut-out portion that accommodates door movement, such as the cut-out portion shown for the bottom 137 of the first load lock 103. Further a single gasket seal may be used to seal the slots 125, 127 of the bottom 139. Similarly, in embodiments in which the second load lock 105 is the top of the stacked load lock system 101, a top 141 of the second load lock 105 may be similar to the top 113 of the first load lock 103. However, because the top 141 of the second load lock 105 does not need to accommodate a door of a load lock above the second load lock 105, the top 141 of the second load lock 105 may be modified accordingly. A single gasket seal may be used to seal the slots 125, 127 of the top 141 of the second load lock 105.

Figure 2:
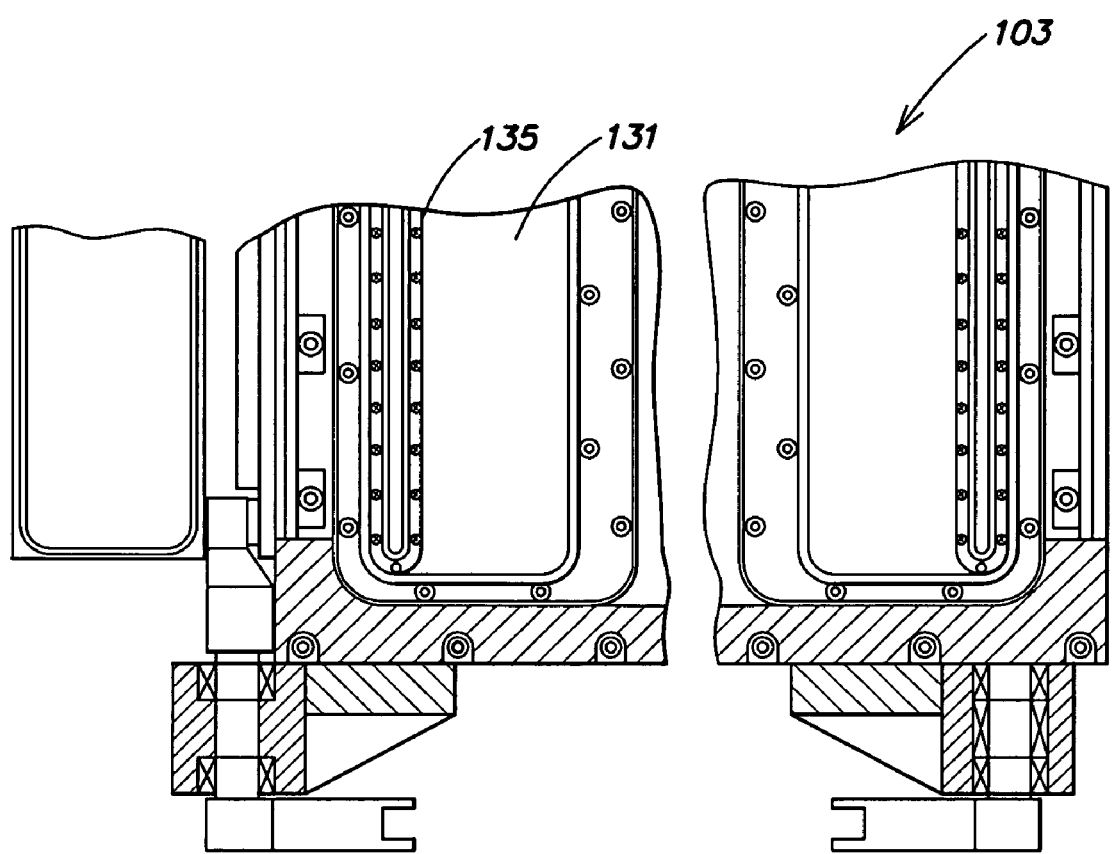
FIG. 2 illustrates a top view of the first load lock in the first exemplary load lock system in accordance with an embodiment of the invention.

FIG. 2 illustrates a top view of the first load lock 103 in the first exemplary load lock system in accordance with an embodiment of the invention. Portions of the load lock sealing surface walls 109-111 have been removed in this view. With reference to FIG. 2, the frame 135 is coupled to the second portion 131 of the top 113 (e.g., a top surface of the second portion 131) of the load lock 103. A gasket (not shown in FIG. 2; 133 in FIG. 1) is below the frame 135 and seals an opening defined by a slot (not shown in FIG. 2; 125 in FIG. 1) in the second portion 131 of the top 113.

Figure 3A:
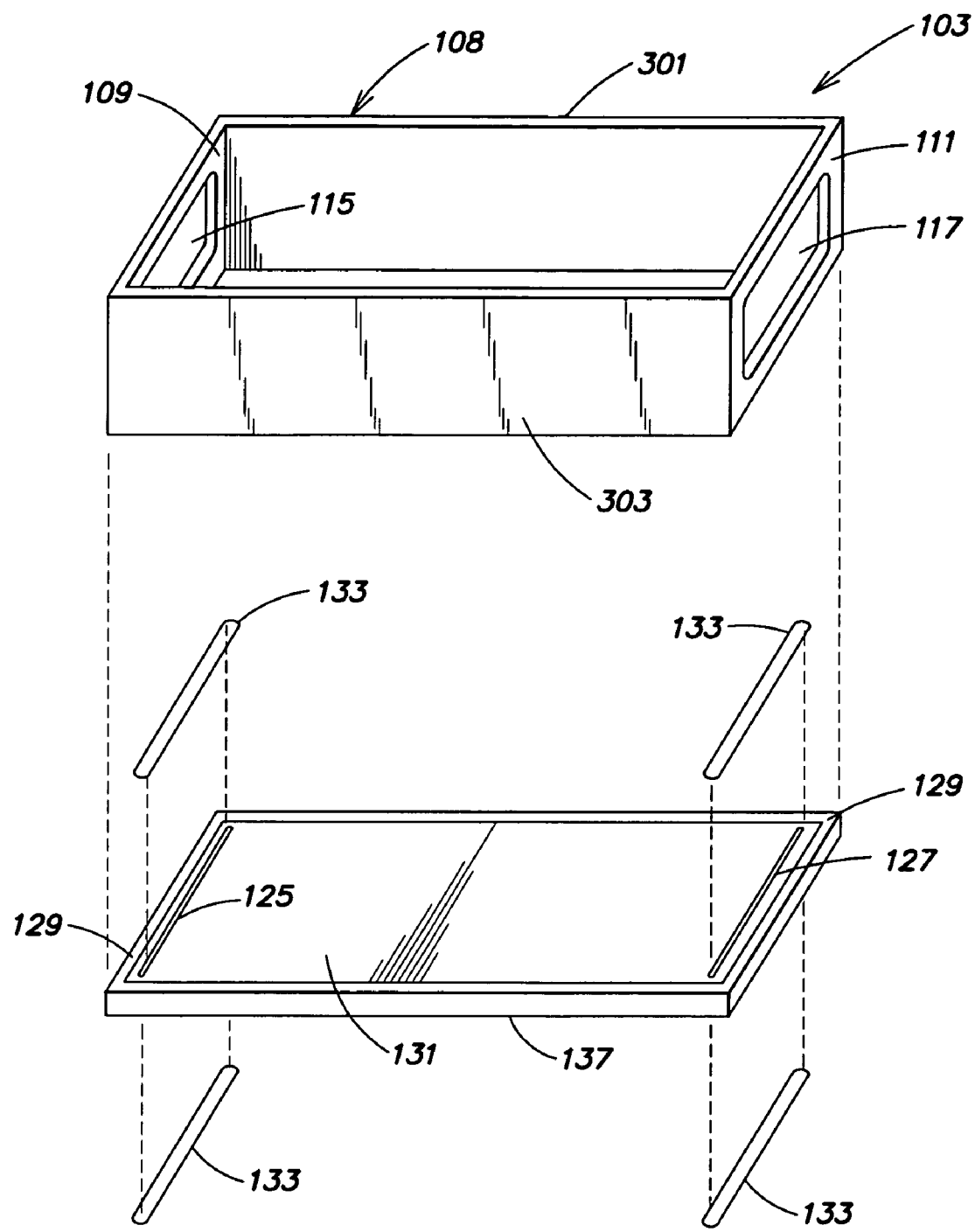
FIG. 3A illustrates an exploded view of portions of the first load lock in accordance with an embodiment of the invention.

FIG. 3A illustrates an exploded view of portions of the first load lock 103 in accordance with an embodiment of the invention. With reference to FIG. 3A, the load lock 103 includes the body 108 that includes the plurality of sealing surface walls 109-111, and sidewalls 301-303. The first and second sealing surface walls 109-111 include sealing surfaces (e.g., flapper door seal surfaces). In one embodiment, the load lock body 108 is a forged aluminum or stainless steel box. The length of the box is about 110 inches, the width of the box is about 88 inches and the height of the box is about 10.5 inches. Further, the thickness of the sealing surface walls 109-111 and/or the sidewalls 301-303 of the box is about 2 inches. The body 108 may be formed from other materials. Further, different load lock body configurations may be employed. For example, the load lock body 108 may include a larger or smaller number of sides and/or may be dimensioned differently.

In one embodiment, the width of the first opening 115 in the first sealing surface wall 109 is about 82.5 inches and the height of the first opening 115 in the first sealing surface wall 109 is about 5.6 inches. The second opening 117 in the second sealing surface wall 111 may be similarly sized. Other dimensions may be used.

The bottom 137 of first load lock 103 may be a one-piece assembly. For example, in the embodiment of FIG. 3A, the bottom 137 is an aluminum separation plate, which includes a machined step (not shown). Other materials similar to aluminum, such as stainless steel or the like may be employed for the bottom 137. In one embodiment, the length of the bottom 137 is about 110 inches, the width of the bottom 137 is about 88 inches and the thickness of the bottom 137 is about 2 inches. Therefore, the bottom 137 of the first load lock 103 may be susceptible to movement due to a pressure in the first load lock 103 and a pressure in the third load lock 107 (FIG. 1). The bottom 137 of the first load lock 103 may be dimensioned differently.

The bottom 137 of the first load lock 103 includes two slots 125, 127 positioned such that the slots 125, 127 define a first portion 129 (e.g., an edge region) and a second portion 131 (e.g., a center portion) of the bottom 137. For example, each slot 125, 127 may be oval-shaped, about 82 inches long and about 0.5 inches wide. Further, the slots 125, 127 define an edge region about 4 inches wide (to a center of the each slot 125, 127). The slots may be shaped, dimensioned and/or positioned differently. Further, a larger or smaller number of slots may be employed.

As stated one or more gaskets 133 may be employed to seal each of the slots 125, 127. Accordingly, each gasket 133 is dimensioned such that the gasket 133 seals the opening defined by the slot 125, 127 to which the gasket 133 is coupled. Although not shown in FIG. 3A, the top 113 of the first load lock 103 may be similar to the bottom 137 of the first load lock 103.

FIGS. 3B and 3C are a top view and a side cross-sectional view, respectively, of a second exemplary bottom 137' for the first load lock 103. The bottom 137' is a multi-piece assembly which includes a stainless steel frame 305 and an aluminum insert 307 (FIG. 3C). Other materials may be used for the frame 305 and/or insert 307. In one embodiment, the length of the bottom 137' is about 110 inches, the width of the bottom 137' is about 88 inches and the thickness of the frame 305 of the bottom 137' is about 2 inches. Therefore, the bottom 137' of the first load lock 103 may be susceptible to movement due to a pressure in the first load lock 103 and a pressure in the third load lock 107 (FIG. 1). The bottom 137' of the first load lock 103 may be dimensioned differently.

Figure 3D:
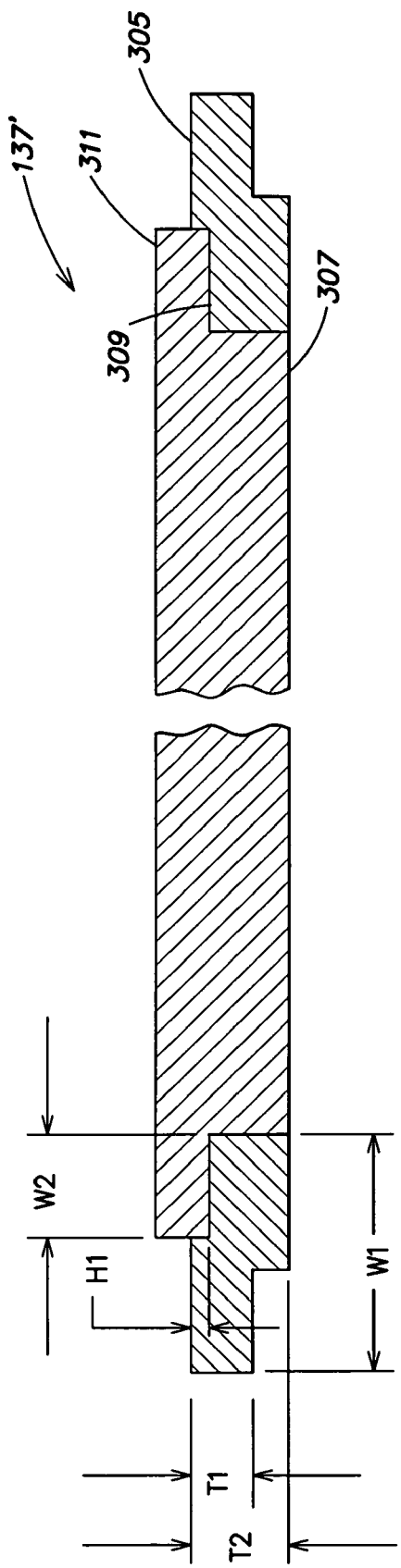
FIG. 3D is an enlarged, side cross-sectional view of the second exemplary bottom of FIGS. 3B and 3C.

FIG. 3D is an enlarged, side cross-sectional view of the second exemplary bottom 137'. As shown in FIG. 3D, in one exemplary embodiment, the steel frame 305 has a width W1 of about 3.7 to about 5.5 inches (depending on whether the steel frame 305 is a "central" or "outer" top or bottom of a load lock system as described below with reference to FIG. 3F), a first thickness T1 of about 2 inches and a second thickness T2 of about 4 inches, with a step 309 formed therein to accommodate the aluminum insert 307. The step 309 has a width W2 of about 1.8 inches, and a height H1 of about 0.2 inches. The aluminum insert 307 may be sized to sit within the frame 305, being supported by a flange 311 of the insert 307 that rests on the step 309 of the steel frame 305. In one embodiment, the thickness of the flange 311 of the insert 307 may be about 1.1 to 2.4 inches, and the total thickness of the insert 307 may be about 4.5 inches. Other dimensions for the frame 305 and/or insert 307 may be employed.

Figure 3E:
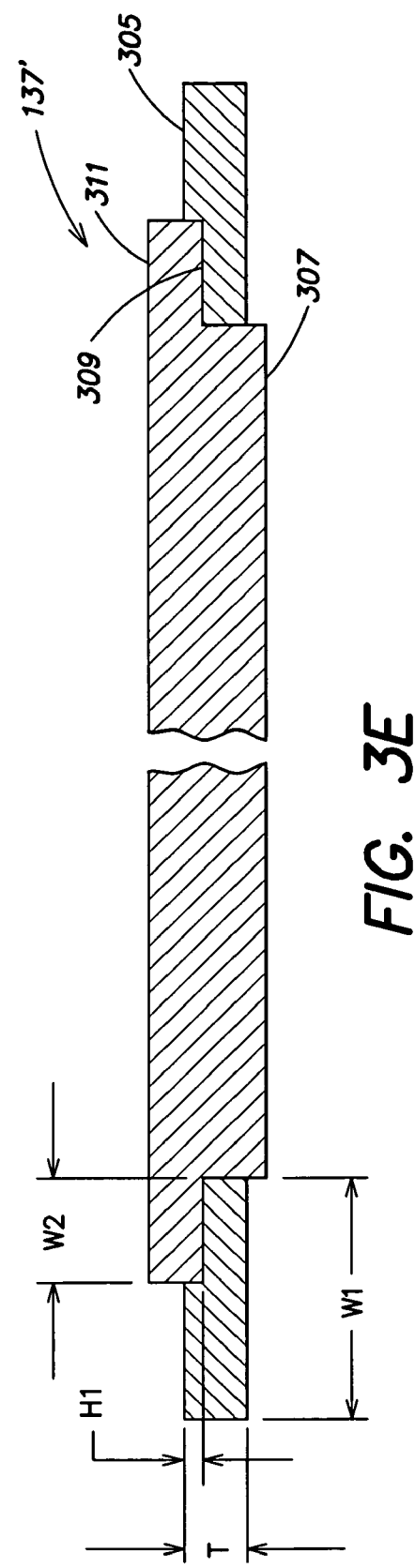
FIG. 3E is an enlarged, side cross-sectional view of an alternative embodiment of the second exemplary bottom of FIG. 3D.

FIG. 3E is an enlarged, side cross-sectional view of an alternative embodiment of the second exemplary bottom 137' that is similar to the embodiment of FIG. 3D, but in which the thickness T of the frame 305 is uniform (e.g., about 2 inches in one embodiment, although other dimensions may be used). The remaining dimensions of the bottom 137' of FIG. 3E may be similar to those of the bottom 137' of FIG. 3D.

Figure 3F:
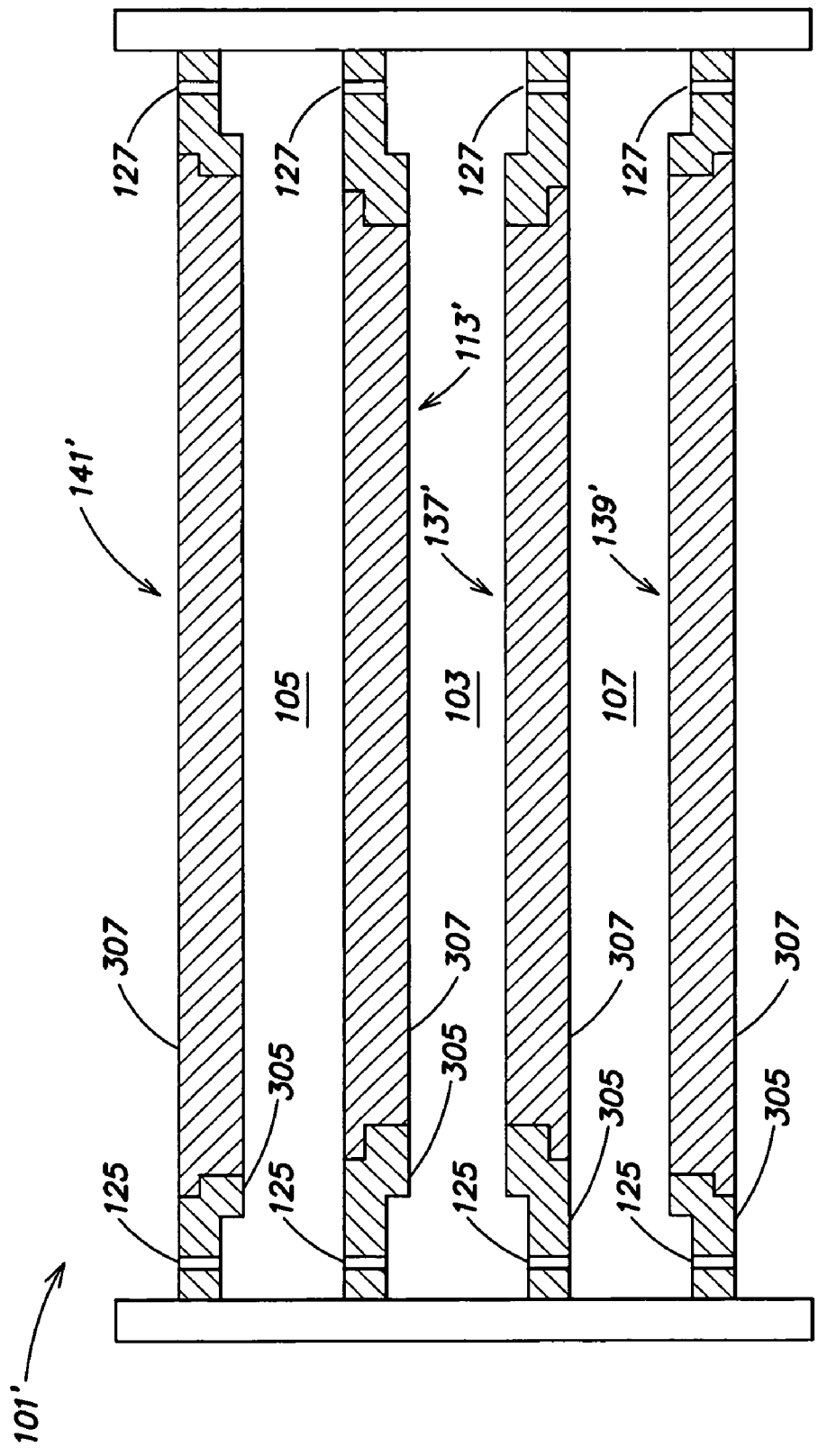
FIG. 3F is a side, partial cross-section view of a second exemplary load lock system in which the bottom of FIGS. 3B-3E is employed.

FIG. 3F is a side, partial cross-section view of a second load lock system 101' in which the second exemplary bottom 137' is employed. The body 108, sealing surface walls 109-111, openings 115-117 and/or load lock doors 119-121 of each load lock 103-107 are not shown in FIG. 3F, but may be similar to those shown in FIG. 1 (although other suitable components may be employed).

The load lock system 101' of FIG. 3F employs a top 113' of the first (center) load lock 103 that is similar to the bottom 137' described with reference to FIGS. 3B-3E. That is, the top 113' includes a frame 305 and insert 307. (The top 141' of the second load lock chamber 105 is similar to the top 113' of the first load lock chamber 103, and the bottom 139' of the third load lock chamber 107 is similar to the bottom 137' of the first load lock chamber 103.) Note that tops and bottoms similar to the bottom 137' of FIG. 3E may be employed.

Figure 3G:
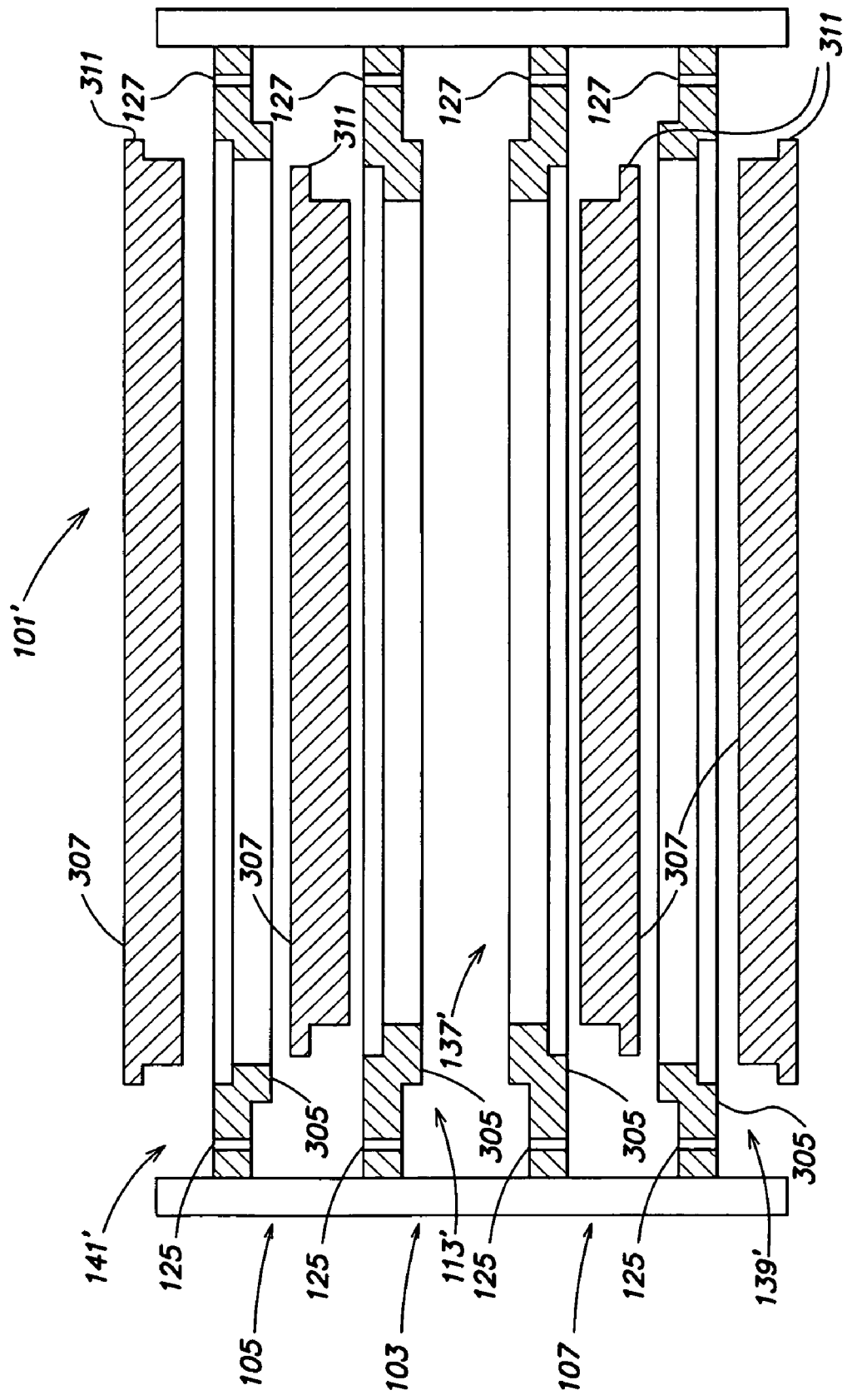
FIG. 3G is an exploded, side partial cross-section view of the components of FIG. 3F.

FIG. 3G is an exploded, side partial cross-section view of the components of FIG. 3F that shows the inserts 307 separated from the frames 305 for each top 113'/bottom 137'. Note that in the embodiment of FIGS. 3F and 3G, the "central" frames 305 of the load lock system 101' extend further into the load lock system 101' so as to allow (1) the insert 307 of the top 113' of the first (center) load lock 103 to be passed through the frame 305 of the top 141' of the second (top) load lock 105; and (2) the insert 307 of the bottom 137' of the first (center) load lock 103 to be passed through the frame 305 of the bottom 139' of the third (bottom) load lock 107. In one embodiment of the invention, the inserts 307 of the top 113' and bottom 137' of the load lock 103 are about 88 inches by 73 inches, the insert 307 of the top 141' of the second load lock 105 is about 95 inches by 81 inches and the insert 307 of the bottom 139' of the third load lock 107 is about 95 inches by 81 inches. The inserts 307 have an overall thickness of about 4.5 inches. Other size inserts may be used. The inserts 307 may be coupled to the frames 305 via any suitable sealing mechanism (e.g., an o-ring) and/or fastening mechanism (e.g., bolts, screws, etc.). In one embodiment, the flange 311 of the two bottom inserts 307 is about 1.1 inches thick, and the flange 311 of the two top inserts 307 is about 2.4 inches thick (e.g., with both top and bottom inserts having a total thickness of about 4.5 inches). In one or more embodiments, the difference in the thicknesses of the top and bottom flanges 311 may allow the volumes of the three load locks 103-107 to be approximately equal. The frames 305 may be similar to the frame 305 of FIG. 3D or FIG. 3E. Other flange/insert sizes and/or shapes may be used.

With reference to FIGS. 3B-3G, the bottom 137' of the first load lock 103 includes two slots 125, 127 positioned such that the slots 125, 127 define a first portion 129 (e.g., an edge region) and a second portion 131 (e.g., a center portion) of the bottom 137' (within the frame 305). For example, each slot 125, 127 may be oval-shaped, about 82 inches long and about 0.5 inches wide. Further, the slots 125, 127 define an edge region about 4 inches wide (to a center of the each slot 125, 127). The slots may be shaped, dimensioned and/or positioned differently. Further, a larger or smaller number of slots may be employed.

Figure 3H:
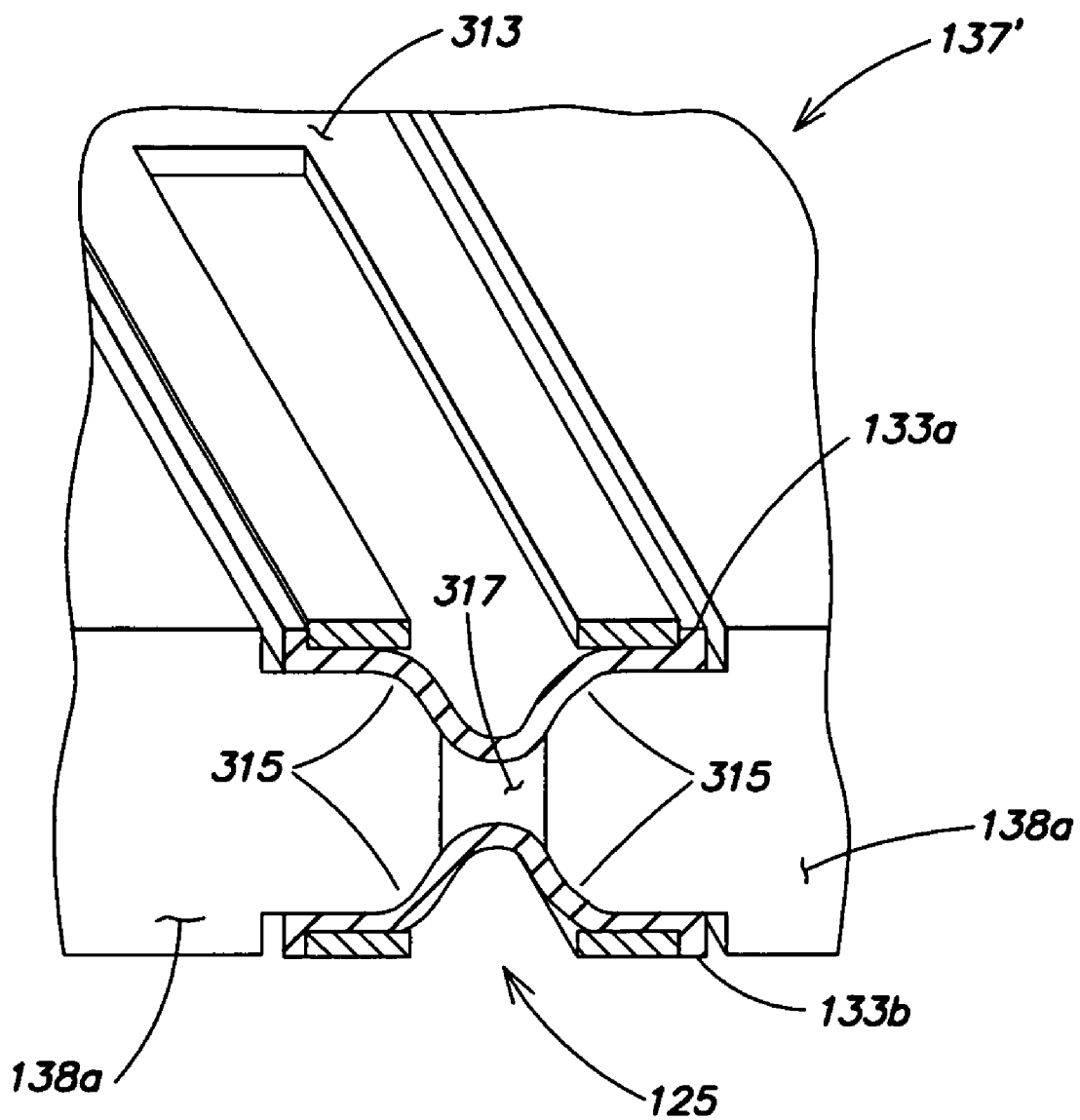
FIG. 3H is a perspective, cross-sectional view of a portion of the bottom of FIGS. 3B-3E that shows an exemplary embodiment of a slot.
Figure 31:
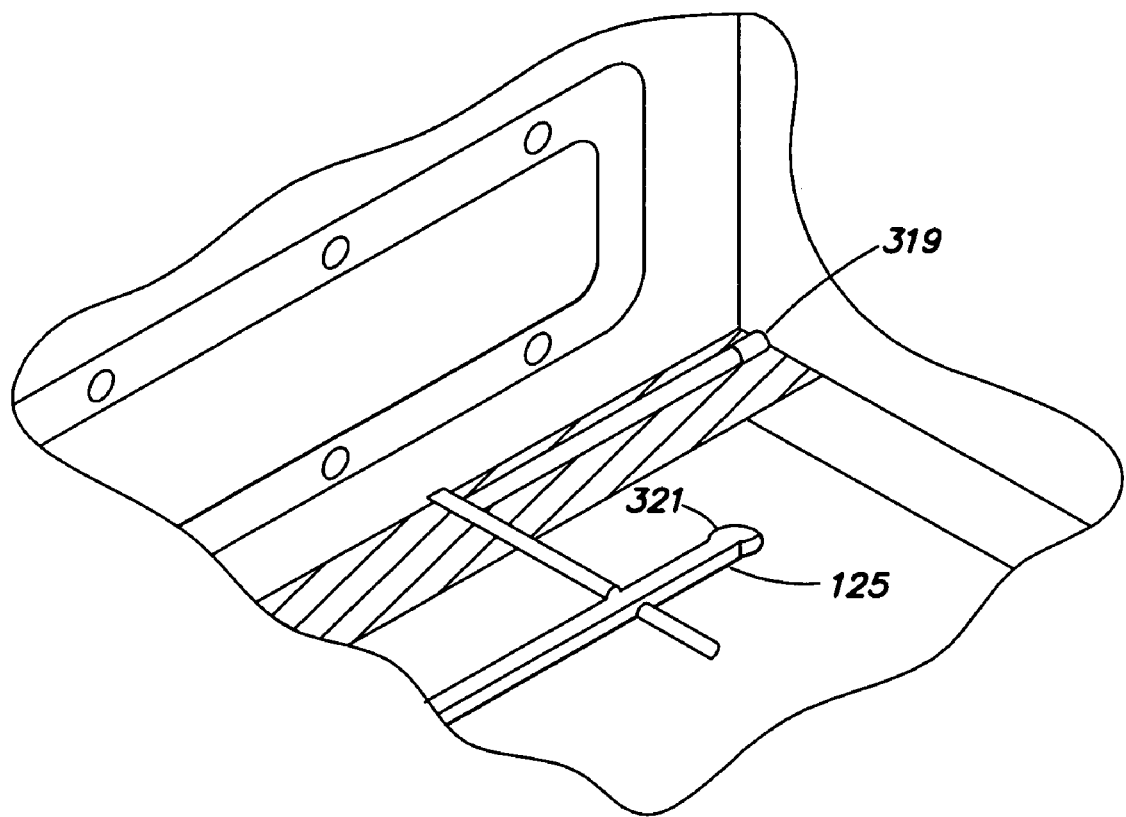

FIG. 3H is a perspective, cross-sectional view of a portion of the bottom 137' of the load lock 103 that shows an exemplary embodiment of the slot 125. The slot 127 may be similarly configured.

The slots 125 are shown within the frame 305 area of the bottom 137'. In one exemplary embodiment, the slot 125 has a width WS of about 0.5 inches. As stated, one or more gaskets 133a-b (e.g., rubber, a fluoroelastomer such as Viton® available from Dupont, metal or another suitable material) may be employed to seal the slot 125. The gaskets 133a-b may be held against the frame 305 via a stainless steel or similar retaining plate 313 or suitable structure (e.g., via bolts, screws or other fasteners). The slot 125 may include steps which accommodate the gaskets 133a-b and/or the retaining plate 313 as shown. In one embodiment, the steps within the slot 125 may be about 0.1 inches in depth, as may be the thickness of the gaskets 133a-b and/or the retaining plate 313. Other step, gasket and/or retaining plate sizes may be used.

The slot 125 may include radius features 315 to relieve pressure induced stress within the bottom 137' (e.g., by avoiding sharp edges which serve as high stress locations). In one embodiment, the radius features 315 may each have a radius of about ⅜ of an inch, although other dimensions may be used.

As shown in FIG. 3H, a cavity 317 is formed between the gaskets 133a-b within the slot 125. In at least one embodiment, the cavity 317 may be evacuated (e.g., to about 500 milliTorr or another suitable pressure) during use of the load lock chamber 103. FIG. 3I is a cross-sectional, perspective view of a portion of the bottom 137' that illustrates an exemplary pumping channel 319 that may be employed to evacuate the slot 125. Other pumping channel configurations may be used. FIG. 3I also illustrates that the slot 125 (and/or the slot 127) may have radiused ends 321 to relieve stress within the slot 125. In one embodiment, the radiused ends 321 form a keyhole-shape having a diameter of about 1 inch, although other sizes may be used.

In operation, during flat panel display and/or electronic device manufacturing, a pressure inside two or more of the load locks 103-107 of the exemplary load lock system 101, 101' may be different. For example, the first, second and third load locks 103-107 may include a first, second and third pressure, respectively. The pressure differential between adjacent load locks 103-107 (and additionally, the ambient pressure) may cause a top and/or bottom of one or more of the load locks 103-107 to move (e.g., deflect vertically). For example, a pressure differential between the first and second load locks 103-105 may cause one or more portions of the top 113, 113' of the first load lock 103, which serves as the bottom of the second load lock 105, to move downward. Downward deflection of the second portion 131 (e.g., center portion) of the top 113, 113' causes the first portion 129 (e.g., the edge region) to deflect (e.g., downward). The slots 125, 127 may cause the center portion of the top 113, 113' to move (e.g., downwardly or upwardly) more than a conventional top which is subjected to the same pressure differential and may cause the edge region of the top 113, 113' to move less than a conventional top which is subjected to the same pressure differential. In this manner, the top 113, 113' of the first load lock 103 is adapted to diminish the movement of the first (edge) portion 129 caused by movement of the second (center) portion 131 of the top 113, 113' of the first load lock 103.

Further, movement of the load lock sealing surface wall 109, 111 (FIG. 1) adjacent the first portion 129 of the top 113, 113' of the first load lock chamber 103 is reduced. More specifically, movement (e.g., upward or downward) of the edge region 129 of the top 113, 113' causes the load lock sealing surface wall 109, 111 adjacent the first portion 129 of the top 113, 113' to move (e.g., upward or downward). However, by reducing the movement of the first portion 129 of the top 113, 113' of the first load lock chamber 103, the movement of the load lock sealing surface wall 109, 111 adjacent the first portion 129 of the top 113, 113' of the first load lock chamber 103 is reduced. Likewise, movement of the load lock sealing surface 122 caused by movement of the first portion 129 of the top 113, 113' of the first load lock 103 is also reduced. Consequently, rubbing is reduced between the gaskets 123, the load lock sealing surface walls 109-111 and the load lock doors 119-121 coupled to the load lock sealing surface walls 109-111. In this manner, wearing of the gaskets 123 and/or other contact surfaces is reduced as is particulate generation and any substrate defects associated therewith.

Through use of the present invention, the sealing surfaces 122 of the load lock 103 (as well as the load locks 105-107) may be isolated from movements of other portions (e.g., a center portion of the top 113, 113') of the load lock 103 caused by a pressure differential between the load lock 103 and adjacent load locks 105-107 (e.g., resulting from pressure fluctuation in one or more load locks 103-107 in the load lock system 101, 101'). Thinner wall thicknesses thereby may be employed, reducing load lock system cost and/or complexity.

Figure 4:
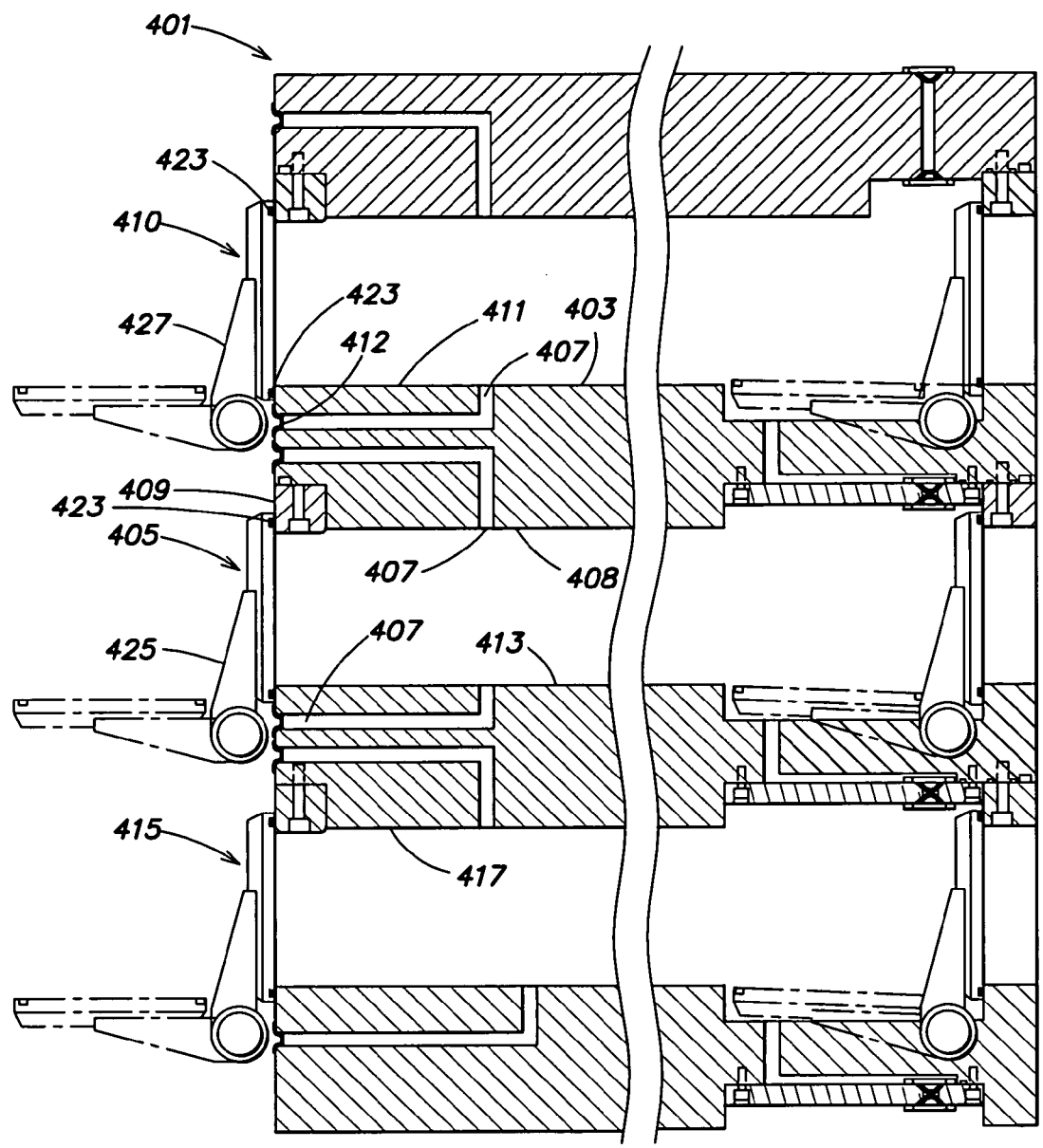
FIG. 4 illustrates a side view of a second exemplary load lock system in accordance with an embodiment of the invention.

FIG. 4 illustrates a side view of a third exemplary load lock system 401 in accordance with an embodiment of the invention. The third exemplary load lock system 401 of FIG. 4 is similar to the first exemplary load lock system 101 of FIG. 1. However, a top and/or bottom of the load locks in the third exemplary load lock system are different from the first exemplary load lock system. With reference to FIG. 4, a top 403 of a first load lock chamber 405 in the third exemplary load lock system 401 is adapted to define a gap 407 between a central portion 408 of the top 403 and a sealing surface wall 409 (e.g., a top of the sealing surface wall 409) of the first load lock chamber 405. In one embodiment of the invention, the gap 407 may be about ¼ in. wide, a first portion of the top 403 adjacent the sealing surface wall 409 is at least about one inch thick and a second portion (e.g., a center portion) of the top 403 is about 4-5 inches thick (although, the top 403 and/or gap 407 may be dimensioned and/or shaped differently).

The top 403 of the first load lock chamber 405 may serve as a bottom of a second load lock chamber 410. In such embodiments, in a manner similar to that described above, the top 403 of the first load lock chamber 405 is adapted to define a gap 407 between the top 403 and a sealing surface wall 411 (e.g., a bottom of the sealing surface wall 411) of the second load lock chamber 410. Alternatively, the top 403 of the first load lock chamber 405 may serve as the top of the third exemplary load lock system 401 if the second load lock chamber 410 is not present.

The top 403 is coupled to the sealing surface wall 409, 411 via a flexible gap sealing member 412, such as a gasket. More specifically, the flexible gap sealing member 412 seals the gaps 407 defined between the top 403 and the sealing surface wall 409, 411. The flexible gap sealing member 412 is employed to reduce movement of the sealing surface walls 409, 411 caused by movement of the top 403. Consequently, rubbing between a gasket 423, which is coupled between the load lock sealing wall 409, 411 and a load lock door 425, 427 is reduced.

Similarly, a bottom 413 of the first load lock chamber 405 in the third exemplary load lock system 401 is adapted to define a gap 407 between the bottom 413 and the sealing surface wall 409 (e.g., a bottom of the sealing surface wall 409) of the first load lock chamber 405. The bottom 413 of the first load lock chamber 405 may serve as a top of a third load lock chamber 415. In such embodiments, in a manner similar to that described above, the bottom 413 of the first load lock chamber 405 is adapted to define a gap 407 between the bottom 413 and a sealing surface wall 417 (e.g., a top of the sealing surface wall 417) of the third load lock chamber 415. Alternatively, the bottom 413 of the first load lock chamber 405 may serve as the bottom of the third exemplary load lock system 401 if the third load lock chamber 415 is not present.

Figure 5:
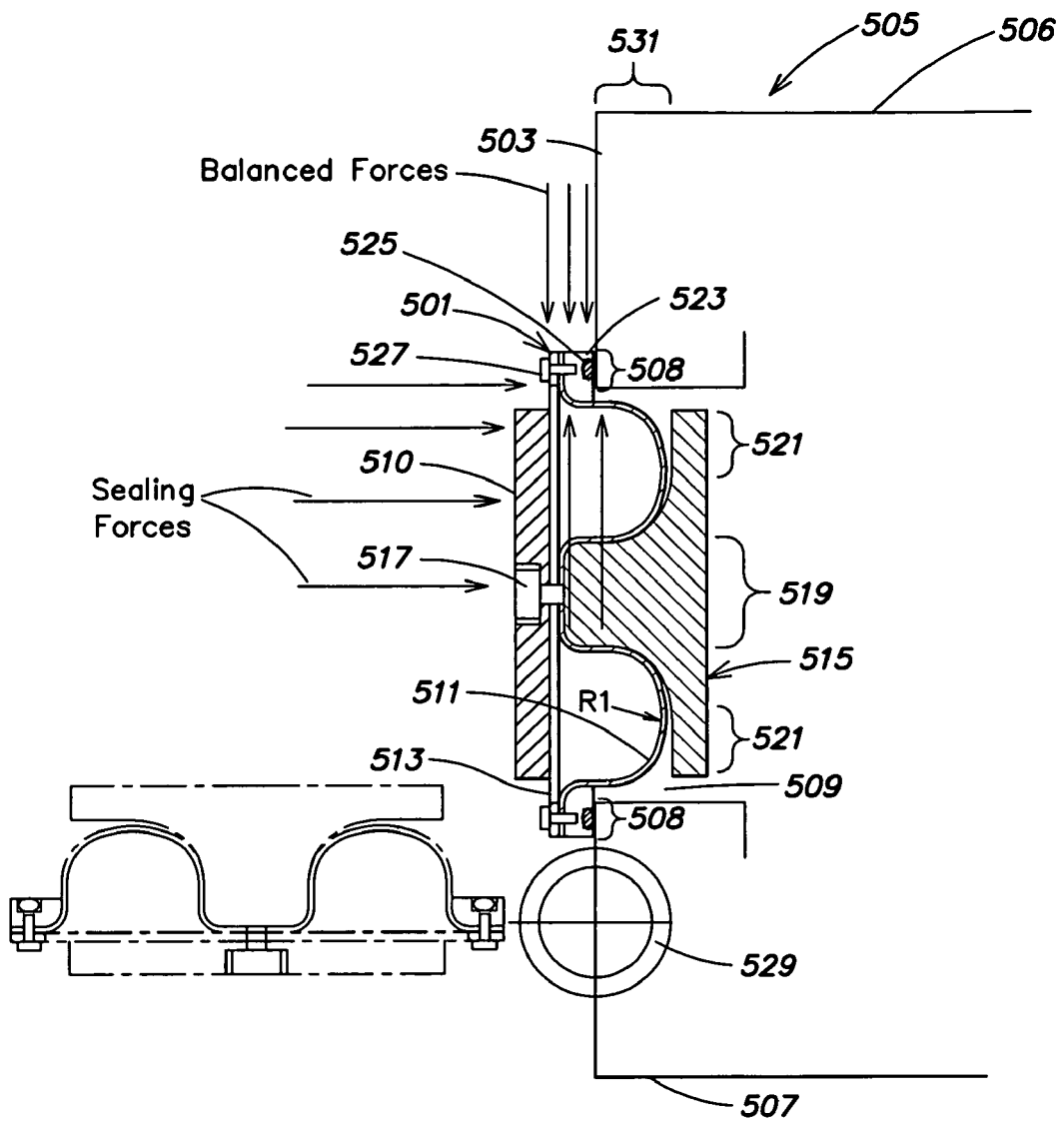
FIG. 5 illustrates a side view of a first exemplary load lock door in accordance with an embodiment of the invention.

FIG. 5 illustrates a side view of a first exemplary load lock door 501 in accordance with an embodiment of the invention. The first exemplary load lock door 501 may seal a load lock chamber during flat panel display and/or electronic device manufacturing. With reference to FIG. 5, the first exemplary load lock door 501 may couple to a sealing surface wall 503 of a load lock 505, which includes a top 506 and a bottom 507. More specifically, the first exemplary load lock door 501 may couple to a sealing surface 508 around an opening 509 in the sealing surface wall 503.

The load lock door 501 includes a first stiffener 510 coupled to a first side (e.g., an outer side) of a bellows 511

(e.g., a bellows/basket) via a frame 513 (e.g., a flexible clamp frame, such as an aluminum or stainless steel frame). A second stiffener 515 is coupled to a second side (e.g., an inner side) of the bellows 511. The first stiffener 510 may be coupled to the second stiffener 515 via one or more bolts 517 or similar connection means. The first and second stiffeners 510, 515 limit movement of the bellows 511, and therefore, provide stiffness to the first exemplary door 501. The first and second stiffeners 510, 515 may be formed from aluminum, stainless steel or the like. The second stiffener 515 is adapted to mate with the second side of the bellows 511.

The bellows 511 is adapted to provide a flexible vacuum seal to the load lock 505. The bellows 511 may include one or more curves R1. The bellows 511 may be formed from an elastomer or a flexible metal, such as stainless steel or the like, or from other materials.

A flexible sealing member 523 is coupled to the second side of the bellows 511. More specifically, a first side of the flexible sealing member 523 is adapted to couple to a perimeter of the bellows 511 and is dimensioned accordingly. The second side of the flexible sealing member 523 is adapted to couple to and form a seal with the sealing surface wall 503 (e.g., at the sealing surface 508 of the sealing surface wall 503), for example, via a gasket 525, such as an O-ring. The flexible sealing member 523 may be formed from aluminum or another suitable material. The flexible sealing member 523 may be coupled to the frame 513 via one or more bolts 527 or similar connection means. Further, the first exemplary door 501 is coupled to the load lock 505 via a shaft 529 which allows the first exemplary door 501 to pivot relative to the load lock 505.

Figure 6:
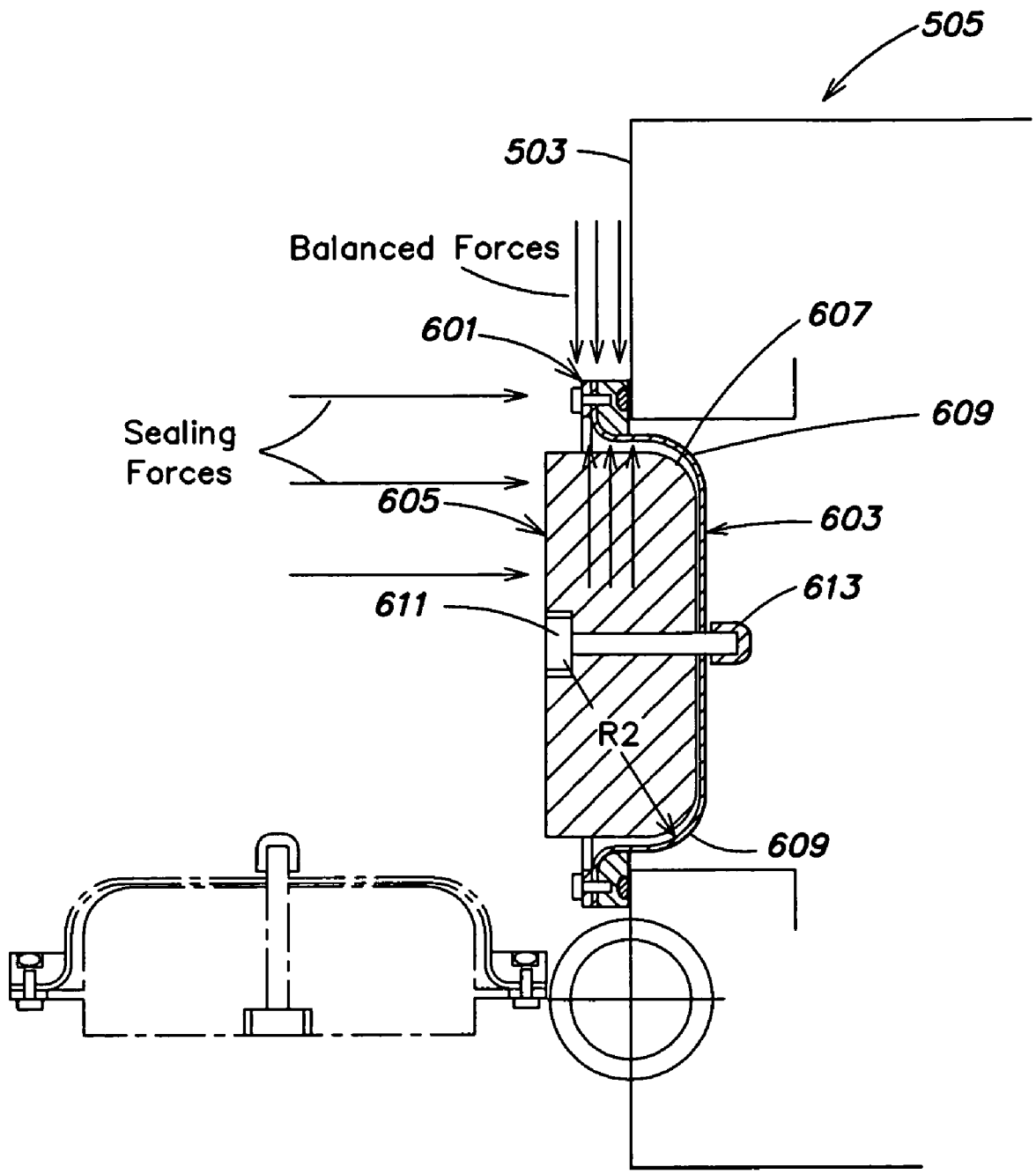
FIG. 6 illustrates a side view of a second exemplary load lock door in accordance with an embodiment of the invention.

FIG. 6 illustrates a side view of a second exemplary load lock door in accordance with an embodiment of the invention. With reference to FIG. 6, the second exemplary load lock door 601 is similar to the first exemplary load lock door 501. However, the number and shape of the stiffeners employed by the second exemplary load lock door 601 is different. Further, the shape of a bellows 603 employed by the second exemplary load lock door 601 is different. For example, edges 609 of the bellows 603 include curves R2.

The second exemplary load lock door 601 includes a stiffener 605 coupled to a first side of the bellows 603. The stiffener 605 is adapted to mate with the bellows 603. More specifically, edges 607 of the stiffener 605 facing the bellows 603 are rounded. A bolt 611 and corresponding nut 613 may be employed to couple the stiffener 605 to the bellows 603, although other connection mechanisms may be employed. The remaining components of the second door 601 may be similar to the first door 501.

The operation of a load lock door in accordance with an embodiment of the present invention is now described with reference to FIG. 5, which illustrates the first exemplary load lock door 501. The second exemplary load lock door 601 operates in a similar manner.

A sealing force, such as ambient pressure, may be applied to the first exemplary load lock door 501. The sealing force, which may be at an angle relative to the direction of movement of the load lock door 501 caused by movement of the top 506 of the load lock 505, biases the load lock door 501 against the load lock sealing surface wall 503. In accordance with the present invention, if the top 506 of the load lock 505 moves, the flexible sealing member 523 moves along with the load lock sealing surface wall 503 of the top 506. Consequently, rubbing between the load lock sealing surface wall 503 and the gasket 525 and/or other contact surfaces is reduced. Therefore, wearing of the gasket 525 and/or other contact surfaces is reduced.

The first exemplary load lock door 501 may be coupled to and/or included in a load lock 505 of a stacked load lock system. For example, the load lock 505 may be stacked below an upper load lock (not shown) and stacked above a lower load lock (not shown). The top 506 of the load lock 505 may serve as a bottom for the upper load lock. The bottom 507 of the load lock 505 may serve as a top for the lower load lock. During flat panel display and/or electronic device manufacturing, pressures in the load lock 505, upper load lock and lower load lock may cause the top 506 and/or bottom 507 of the load lock 505 to move (e.g., deflect) as previously described. For example, a portion of the top 506, such as the perimeter 531, may move due to differing pressures within the load locks.

Further, movement of the perimeter 531 of the top 506 causes the load lock sealing surface wall 503 to move (e.g., upward or downward). Consequently, the sealing surface 508 in the sealing surface wall 503 moves.

Through use of the present invention, one or more portions of a load lock door (e.g., sealing features of the load lock door) 501 move in conjunction with a load lock sealing surface wall 503 during flat panel display and/or electronic device manufacturing. Although the load lock door is rigid enough to seal the load lock chamber, the load lock door is flexible enough to move with the load lock sealing surface wall.

The foregoing description discloses only exemplary embodiments of the invention. Modifications of the above disclosed apparatus and methods which fall within the scope of the invention will be readily apparent to those of ordinary skill in the art. Although one or more of the above methods and apparatus are described with respect to a load lock chamber, in other embodiments the present methods and apparatus may be employed by other types of chambers employed during flat panel display and/or electronic device manufacturing.

In at least one embodiment of the invention, a method is provided that includes the steps of (1) providing one of the inventive load lock chambers described herein; (2) storing a substrate within the load lock chamber; (3) transferring the substrate from the load lock chamber to a processing chamber; and (4) processing the substrate within the processing chamber (e.g., by performing a flat panel display and/or electronic device manufacturing process on the substrate). For example, the load lock chamber may be coupled to the processing chamber by a transfer chamber, and the substrate may be transferred between the load lock chamber and the processing chamber via a vacuum robot positioned with the transfer chamber. The substrate may be returned to the load lock chamber after processing within the processing chamber.

Accordingly, while the present invention has been disclosed in connection with exemplary embodiments thereof, it should be understood that other embodiments may fall within the spirit and scope of the invention, as defined by the following claims.

The invention claimed is:

1. A load lock chamber comprising:
a body having:
at least one sealing surface wall including a sealing surface, the sealing surface wall having an opening adjacent the sealing surface adapted to input or output a substrate; and
a plurality of side walls;
a top member coupled to the body, wherein the top member includes one or more elongated slots that extend through an entire thickness of the top member and divide the top member into a first portion and a second portion;

one or more top sealing members adapted to cover each elongated slot in the top member, wherein each top sealing member absorbs a lateral movement of the first portion of the top member along a longitudinal dimension of the top member relative to the second portion of the top member; and a load lock door adapted to close and seal the opening in the sealing surface wall of the body, wherein the load lock door includes a sealing member adapted to contact and seal against the sealing surface of the sealing surface wall, and wherein the first portion of the top member contacts the sealing surface wall.

2. The load lock chamber of claim 1 wherein the one or more top sealing members reduce movement of the first portion of the top member and the sealing surface wall so as to reduce wear of the sealing member of the load lock door.

3. The load lock chamber of claim 1 wherein the load lock door is adapted to move with the sealing surface wall.

4. The load lock chamber of claim 1 wherein the one or more elongated slots in the top member are oval-shaped.

5. The load lock chamber of claim 1 wherein the top member includes:

a frame; and an insert positioned within the frame.

6. The load lock chamber of claim 5 wherein the frame comprises stainless steel and the insert comprises aluminum.

7. The load lock chamber of claim 5 wherein the one or more slots in the top member are formed within the frame.

8. The load lock chamber of claim 1 further comprising:

a bottom coupled to the body, wherein the bottom includes one or more elongated slots that divide the bottom into a first portion and a second portion; and one or more bottom sealing members adapted to cover each elongated slot in the bottom, wherein each bottom sealing member absorbs a movement of the first portion of the bottom relative to the second portion of the bottom.

9. The load lock chamber of claim 8 wherein:

the first portion of the bottom contacts the sealing surface wall.

10. The load lock chamber of claim 9 wherein the one or more bottom sealing members reduce movement of the first portion of the bottom and the sealing surface wall so as to reduce wear of the sealing member of the load lock door.

11. The load lock chamber of claim 8 wherein the one or more elongated slots in the bottom are oval-shaped.

12. The load lock chamber of claim 8 wherein the bottom includes:

a frame; and an insert positioned within the frame.

13. The load lock chamber of claim 12 wherein the frame comprises stainless steel and the insert comprises aluminum.

14. The load lock chamber of claim 12 wherein the one or more elongated slots in the bottom are formed within the frame.

15. The load lock chamber of claim 1 wherein each top sealing member comprises a flexible gap sealing member, and a support member that holds the flexible gap sealing member against the top member to cover each of said elongated slots.

16. The load lock chamber of claim 15, wherein the support member comprises a stainless steel retaining plate.

* * * * *